(12) United States Patent
Kim

(10) Patent No.: US 8,253,480 B2
(45) Date of Patent: Aug. 28, 2012

(54) INTERNAL VOLTAGE CONTROL CIRCUIT

(75) Inventor: Jong-Sam Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 139 days.

(21) Appl. No.: 12/829,900

(22) Filed: Jul. 2, 2010

(65) Prior Publication Data

US 2011/0156807 A1 Jun. 30, 2011

(30) Foreign Application Priority Data

Dec. 29, 2009 (KR) ........................ 10-2009-0133386

(51) Int. Cl.
*G05F 1/10* (2006.01)
(52) U.S. Cl. ........................................ 327/540; 323/312
(58) Field of Classification Search ........................ None
See application file for complete search history.

(56) References Cited

U.S. PATENT DOCUMENTS

| 5,535,169 | A * | 7/1996 | Endo et al. | 365/189.04 |
| 5,781,494 | A * | 7/1998 | Bae et al. | 365/230.03 |
| 6,021,082 | A * | 2/2000 | Shirai | 365/226 |
| 6,195,306 | B1 * | 2/2001 | Horiguchi et al. | 365/226 |
| 6,704,237 | B2 * | 3/2004 | Park | 365/226 |
| 7,038,957 | B2 * | 5/2006 | Kwack et al. | 365/201 |
| 7,046,571 | B2 * | 5/2006 | Kim et al. | 365/226 |
| 7,183,816 | B2 * | 2/2007 | Martelloni | 327/112 |
| 7,301,848 | B2 * | 11/2007 | Jin | 365/226 |
| 7,835,204 | B2 * | 11/2010 | Kim et al. | 365/194 |
| 7,936,613 | B2 * | 5/2011 | Kang | 365/189.07 |
| 7,999,576 | B2 * | 8/2011 | Chi | 327/1 |
| 2011/0103162 | A1 * | 5/2011 | Park | 365/194 |

FOREIGN PATENT DOCUMENTS

| JP | 2006-251876 | 9/2006 |
| KR | 100798772 | 1/2008 |
| KR | 100849063 | 7/2008 |

OTHER PUBLICATIONS

Notice of Preliminary Rejection issued from Korean Intellectual Property Office on Apr. 18, 2011.
Office Action issued by the Korean Intellectual Property Office on Dec. 30, 2011.

* cited by examiner

*Primary Examiner* — Thomas J Hiltunen
(74) *Attorney, Agent, or Firm* — IP & T Group LLP

(57) ABSTRACT

An internal voltage control circuit includes active drivers, a control unit, and a time interval adjustment unit. The active drivers are configured to receive a common internal voltage. The control unit is configured to control respective enable operations of the active drivers. The time interval adjustment unit is configured to respectively supply enable signals, generated by the control unit, to the active drivers at respective predetermined time intervals.

20 Claims, 3 Drawing Sheets

INTERNAL VOLTAGE CONTROL CIRCUIT

CROSS-REFERENCE TO RELATED APPLICATIONS

The present application claims priority of Korean Patent Application No. 10-2009-0133386, filed on Dec. 29, 2009, which is incorporated herein by reference in its entirety.

BACKGROUND OF THE INVENTION

Exemplary embodiments of the present invention relate to an internal voltage control circuit which may reduce an operating current by distributing an operating time.

Semiconductor devices are used in various fields. For example, semiconductor devices are used to store a variety of data. Since such semiconductor devices are used in various portable devices, including laptop computers and notebook computers, they are required to be high-capacity, high-speed, compact, and low-power.

Semiconductor devices use an external power supply voltage to generate internal voltages having various levels. Specifically, a semiconductor memory device (DRAM) generates a core voltage (VCORE) which is to be used in a bank region (CORE) and a peripheral region (PERI), a high voltage (VPP) which is higher than an external voltage (VDD) and is to be applied to a gate of a cell transistor (word line), and a back bias voltage (VBB) which is lower than a ground voltage (VSS) and is to be used in a bulk portion of a cell transistor.

In order to generate these internal voltages, a charge pumping scheme for VBB and VPP and a down converting scheme for VCORE are used. Without regard to the schemes, an internal reference voltage (VREF) is primarily generated, and new internal voltages (VBB, VPP, VCORE) are secondarily generated from the internal reference voltage (VREF).

Ideally, such an internal reference voltage should have a constant level with regard to process, voltage and temperature (PVT) variations at a low operating voltage.

FIG. 1 is a configuration block diagram of a conventional internal voltage control circuit.

Referring to FIG. 1, core voltage (VCORE) active drivers 10 and 11 for generating a core voltage are provided in a bank core region 40, the bank core region 40 being a first bank region. Also, (VCORE) active drivers 16 and 21 for generating a core voltage are provided in a bank core region 60, the bank core region 60 being a second bank region.

In a peripheral region 50 in which bank control circuits are provided, a plurality of core voltage (VCORE) active drivers 12 to 15 and 17 to 20 are provided around a core voltage (VCORE) control unit 30. The core voltage control unit 30 controls the driving of the core voltage active drivers provided in the bank regions 40 and 60 and the peripheral region 50, on the basis of bank active flag signals BANK_ACT_FLAG<0:X>.

The conventional internal voltage control circuit having the above-described configuration operates as follows.

The semiconductor device includes a plurality of banks, stores data in the banks, and reads out data stored in the banks. The core voltage active drivers are used for supplying voltages to the plurality of banks and for supplying voltages to be used in control circuits of the banks.

Accordingly, the core voltage control unit 30 determines a bank to be operated by decoding the bank active flag signals BANK_ACT_FLAG<0:X>. The core voltage control unit 30 enables the core voltage active driver to supply a voltage to the selected bank, and the core voltage active driver supplies a voltage to the control circuit of the selected bank.

There is no problem when the single bank and its control circuit are activated. However, in a case in which all banks are activated, as in an auto-refresh operation mode, that is, when all of the bank active flag signals BANK_ACT_FLAG<0:X> are enabled, the core voltage control unit 30 simultaneously drives all of the core voltage active drivers 10 to 21 provided in the first and second bank regions 40 and 60 and the peripheral region 50.

In this case, a large amount of IDD current is required when all of the core voltage active drivers 10 to 21 are simultaneously driven. Specifically, in the auto-refresh operation mode, excessive IDD current and VCORE peak current are caused when all of the core voltage active drivers simultaneously operate, resulting in a VDD voltage level drop. If the VDD voltage level drop is caused by the generation of the core voltage, a current to be supplied to other circuits (e.g.—the VPP pump circuit) becomes insufficient. Thus, other circuits may fail to operate.

SUMMARY OF THE INVENTION

An embodiment of the present invention is directed to an internal voltage control circuit which may reduce an operating current by distributing a drive operating time according to an amount of core current and Locations of active drivers.

In accordance with an embodiment of the present invention, an internal voltage control circuit includes active drivers configured to receive a common internal voltage, a control unit configured to control enable operations of the respective active drivers, and a time interval adjustment unit configured to respectively supply an enable signal, generated by the control unit, to the active drivers at respective predetermined time intervals.

In accordance with another embodiment of the present invention, an internal voltage control circuit includes active drivers configured to receive a common internal voltage and a control block configured to control enable operations of the active drivers at respective predetermined time intervals during simultaneous operations of a number of banks.

DESCRIPTION OF EXEMPLARY EMBODIMENTS

Figure 1:
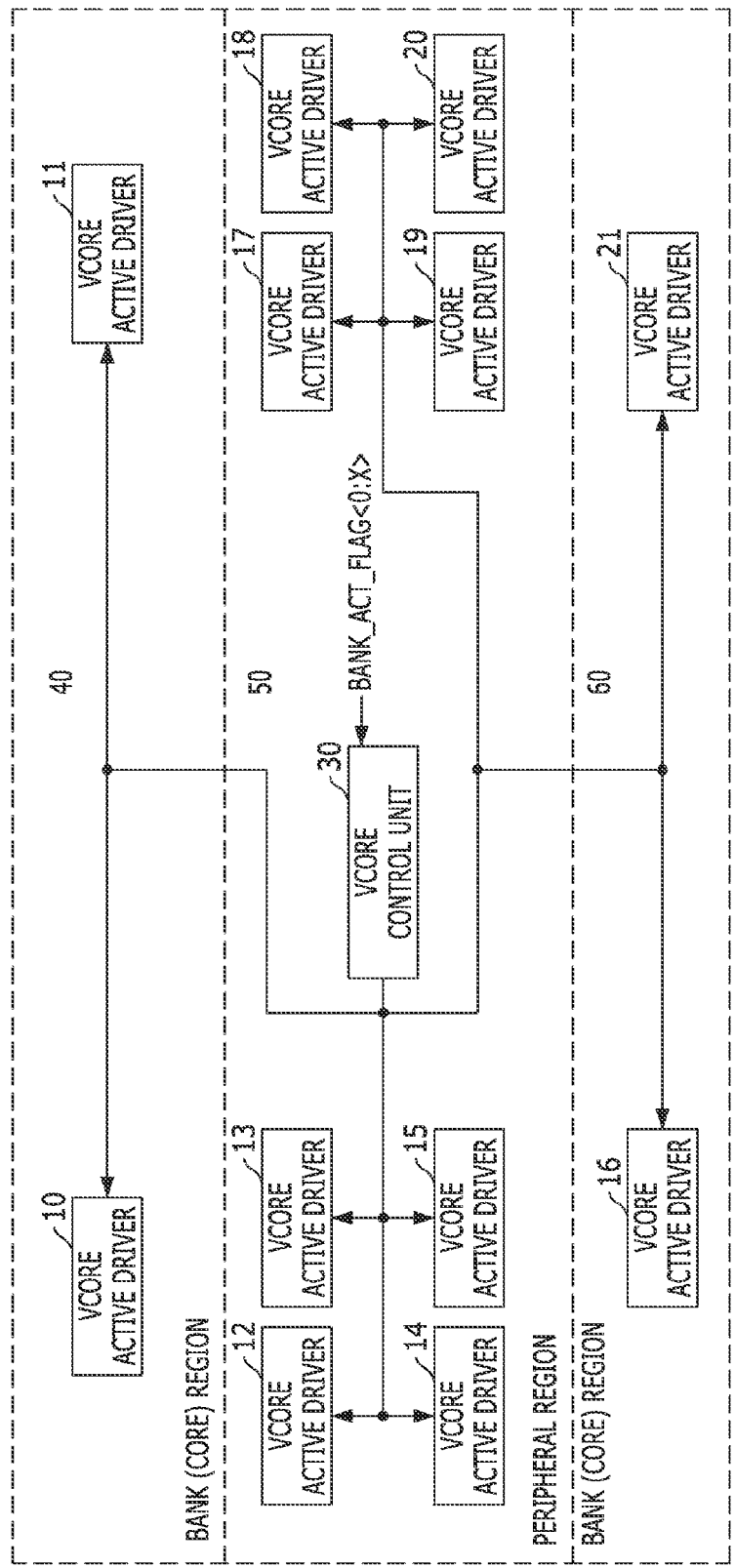
FIG. 1 is a block diagram illustrating an overall configuration of a conventional internal voltage control circuit.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
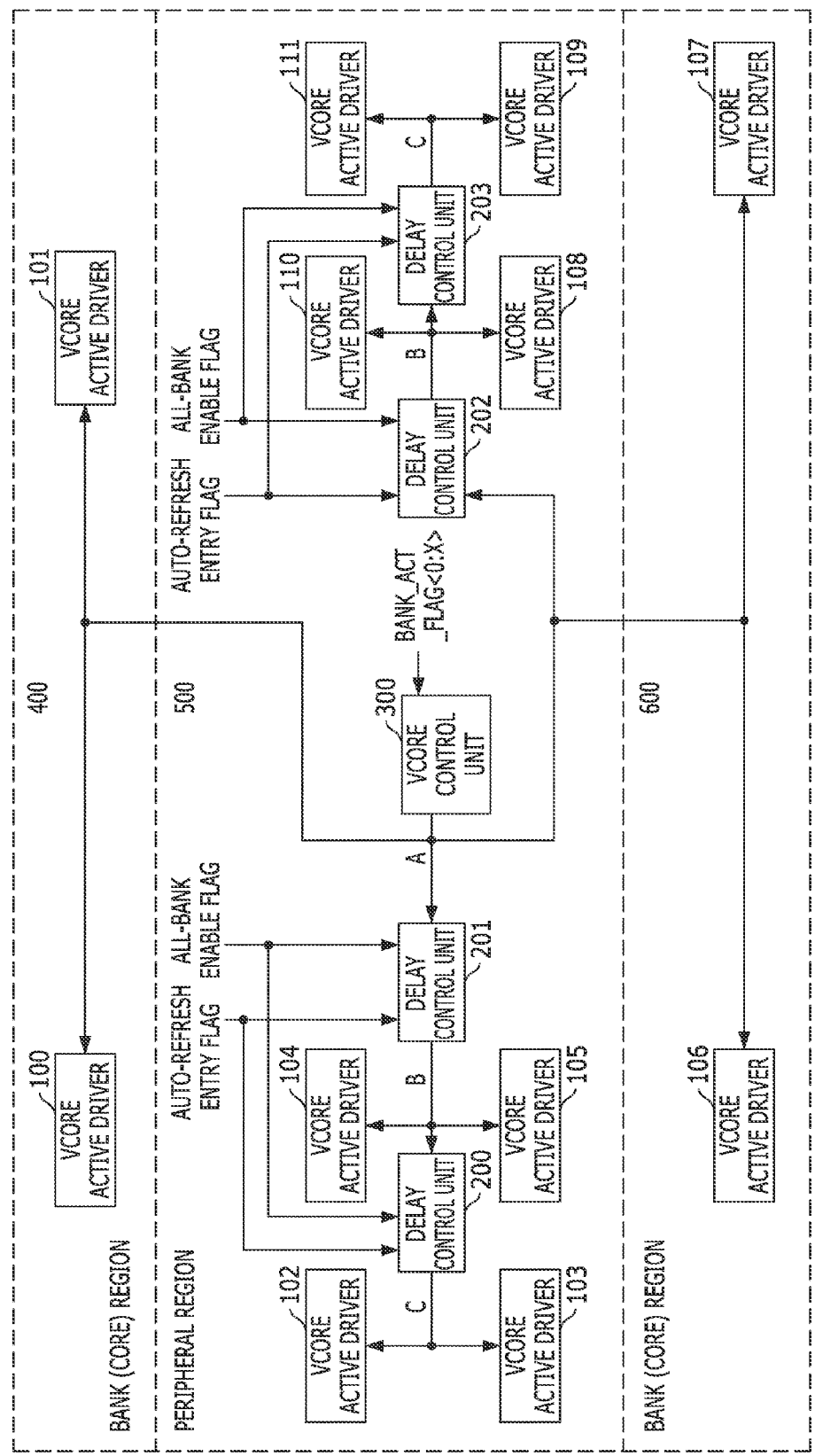
FIG. 2 is a block diagram illustrating an overall configuration of an internal voltage control circuit in accordance with an embodiment of the present invention.

FIG. 2 is a block diagram of an internal voltage control circuit in accordance with an embodiment of the present invention.

Referring to FIG. 2, core voltage (VCORE) active drivers 100 and 101 for generating a core voltage are provided in a bank core region 400, the bank core region 400 being a first bank core region. Also, core voltage (VCORE) active drivers 106 and 107 for generating a core voltage are provided in a bank core region 600, the bank core region 600 being a second bank region.

In a peripheral region 500 in which bank control circuits are provided, a plurality of core voltage (VCORE) active drivers 102 to 105 and 108 to 111 are provided around a core voltage (VCORE) control unit 300. The core voltage control unit 300 controls the driving of the core voltage active drivers provided in the bank regions 400 and 600 and the peripheral region 500, on the basis of bank active flag signals BANK_ACT_FLAG<0:X>.

Meanwhile, the operation of the core voltage active drivers is controlled, while adjusting time intervals of their operating times. Specifically, when a large amount of IDD current is needed, as in an auto-refresh operation mode in which all banks simultaneously operate, an operating time of each core voltage active driver may be adjusted according to its location and an amount of current needed.

Therefore, the internal voltage control circuit is divided into a core voltage active driver group which may be operated in response to a first enable signal (output A) of the core voltage control unit 300, a core voltage active driver group which may be operated in response to a second enable signal (output B) generated by delaying the first enable signal generated by the core voltage control unit 300 for a predetermined time (i.e. 1 hour), and a core voltage active driver group which may be operated in response to a third enable signal (output C) generated by delaying the second enable signal for the predetermined time (i.e. 1 hour).

To this end, the internal voltage control circuit includes delay control units 201 and 202 configured to generate the second enable signal (output B) by delaying the first enable signal (output A) for the predetermined time, and delay control units 200 and 203 configured to generate the third enable signal (output C) by delaying the second enable signal for the predetermined time.

The core voltage active driver group operated in response to the first enable signal (output A) includes the core voltage active drivers 100 and 101 disposed in the first bank area 400, and the core voltage active drivers 106 and 107 disposed in the second bank 600.

The core voltage active driver group operated in response to the second enable signal (output B) includes the core voltage active drivers 104 and 105 and the core voltage active drivers 108 and 110 disposed in the peripheral region 500.

The core voltage active driver group operated in response to the third enable signal (output C) includes the core voltage active drivers 102 and 103 and the core voltage active drivers 111 and 109 disposed in the peripheral region 500.

Figure 3:
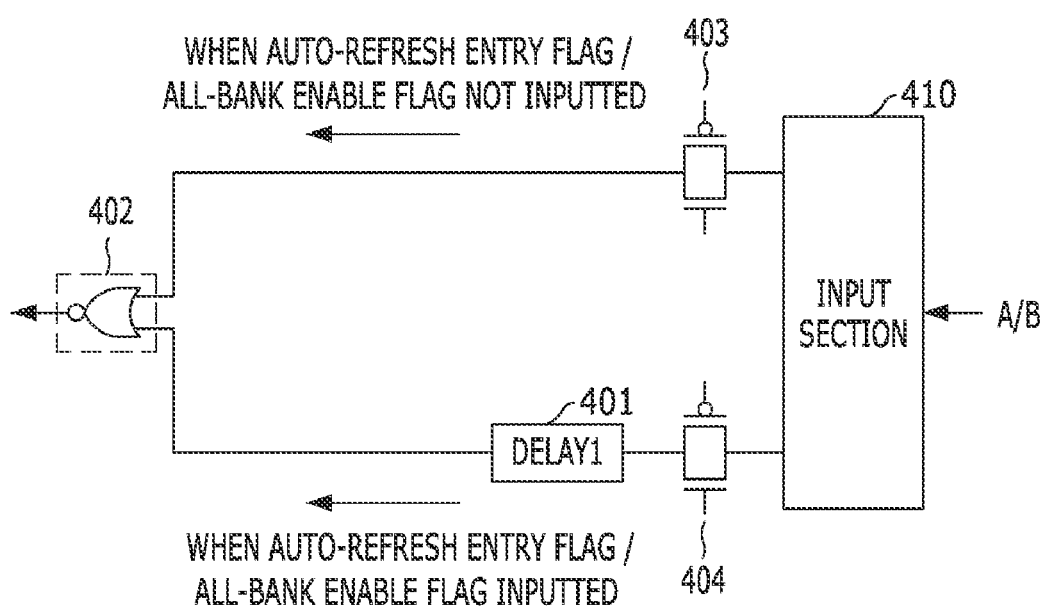
FIG. 3 is a detailed configuration diagram illustrating a delay control unit of FIG. 2.

The operation time intervals of the core voltage active drivers may be set because the drivers can be controlled based on their locations. To this end, the delay control units 200 to 203 are configured as illustrated in FIG. 3.

Each of the delay control units 200 to 203 includes an input section 410, first and second switches 403 and 404, a delay section 401 (DELAY 1), and an output section 402. The input section 410 is configured to input the enable signal A generated by the core voltage control unit 300, or the enable signal B outputted by the delay control units 201 and 202. The first and second switches 403 and 404 are configured to transfer the enable signal received from the input section 410. The delay section 401 is configured to delay the enable signal transferred from the second switch 404 by a predetermined time. The output section 402 is configured to output the signal transferred from the first switch 403, or the delayed signal outputted from the delay section 401. The first and second switches 403 and 404 may be configured with transmission gates, and the output section 402 may be configured with a NOR gate. The first switch 403 transfers the inputted enable signal when an auto-refresh entry flag signal or an all-bank enable flag signal, for example, is not inputted. On the other hand, the second switch 404 transfers the inputted enable signal when the auto-refresh entry flag signal or the all-bank enable flag signal, for example, is inputted.

The operation of the internal voltage control circuit having the above-described configuration in accordance with the embodiment of the present invention will be described below.

The operation of the internal voltage control circuit is divided into two control operations. The first control operation corresponds to a case in which the auto-refresh entry flag signal or the all-bank enable flag signal, for example, is not applied. In this case, the enable signal generated by the core voltage control unit 300 is directly provided to the corresponding core voltage active driver, without being delayed. Typically, this case corresponds to a case in which a specific bank is activated.

That is, one of the bank active flag signals BANK_ACT FLAG<0:X> is inputted to the core voltage control unit 300, and the core voltage control unit 300 decodes the inputted address and generates the enable signal which activates the core voltage active driver of the corresponding bank. The auto-refresh entry flag signal or the all-bank enable flag signal, for example, are not provided by the device which provides a control signal, such as a mode register set (MRS). The second switch 404 maintains a turned-off state, and the first switch 403 is turned on.

Therefore, the enable signal generated by the core voltage control unit 300 passes through the first switches 403 included in the delay control units 200 to 203, and is provided to the corresponding core voltage active drivers. In this case, the enable signal generated by the core voltage control unit 300 is provided to the corresponding core voltage active driver, without any delay procedure.

The second control operation is a case in which the auto-refresh entry flag signal or the all-bank enable flag signal, for example, is applied. In this case, the enable signal generated by the core voltage control unit 300 is delayed and provided to the core voltage active driver at time intervals. Typically, this case corresponds to a case in which all banks are activated when in the auto-refresh operation mode, for example.

That is, when all addresses included in the bank active flag signals BANK_ACT_FLAG<0:X> are inputted to the core voltage control unit 300, the core voltage control unit 300 generates the enable signal which activates all of the core voltage active drivers.

The auto-refresh entry flag signal and the all-bank enable flag signal are provided by the device which provides a control signal, such as a mode register set (MRS). The second switch 404 is turned on, and the first switch 403 is turned off.

Preferentially, the enable signal generated by the core voltage control unit 300 activates the core voltage active drivers 100, 101, 106 and 107 disposed in the first bank region 400 and the second bank region 600 which require a fast response.

Then, the enable operation of the core voltage active driver disposed in the peripheral region 500 which does not require a fast response is controlled. That is, the enable signal (output A) generated by the core voltage control unit 300 is inputted to the delay control units 201 and 202.

Since the second switch 404 inside the delay control units 201 and 202 maintain a turned-on state, the enable signal A is delayed through the delay section 401 by a first delay time and outputted as the enable signal B. The enable signal B enables the core voltage active drivers 104, 105, 110 and 108 to operate. The enable signal B is a signal generated by delaying the signal A by the first delay time.

Subsequently, the enable signal B having passed through the delay section 401 is inputted to the delay control units 200 and 203. Since the second switch 404 maintains the turned-on state, the signal B is delayed through the delay section 401 by a second delay time and outputted as the enable signal C. The enable signal C enables the core voltage active drivers 102, 103, 111 and 109 to operate. The enable signal C is a signal generated by delaying the enable signal A by the sum of the first delay time and the second delay time.

Therefore, when using the core voltage current, the drive disposed in the bank region (core region) which requires a fast response is operated quickly. The driver disposed in the peripheral region which does not require a relatively fast response compared with the bank region is controlled to operate at predetermined time intervals in a distributed manner. Thus, it is possible to suppress the generation of IDD peak current which may be caused by the simultaneous operations of many or all of the banks.

When all of the banks are simultaneously operated when in the auto-refresh operation mode, for example, the operating time of the active drivers disposed in each region is distributed while dividing the regions into a region which requires a fast response, such as the bank region, and a peripheral region in which a relatively slow response is possible as compared with the bank region. Therefore, the peak current value due to the instantaneous operation of many or all of the banks can be reduced.

While the present invention has been described with respect to exemplary embodiments, it will be apparent to those skilled in the art that various changes and modifications may be made without departing from the spirit and scope of the invention as defined by the following claims.

What is claimed is:

1. An internal voltage control circuit comprising:
   a plurality of active drivers configured to receive a common internal voltage;
   a control unit configured to control respective enable operations of the plurality of active drivers; and
   a time interval adjustment unit configured to respectively supply an enable signal, generated by the control unit, to the plurality of active drivers at respective predetermined time intervals,
   wherein the time interval adjustment unit comprises:
      an input section configured to input the enable signal generated by the control unit;
      a first output path section configured to output the enable signal generated by the control unit; and
      a second output path section configured to delay the enable signal generated by the control unit by a predetermined delay time interval.

2. The internal voltage control circuit of claim 1, wherein the first output path section is configured to operate when one bank active operation is to be performed.

3. The internal voltage control circuit of claim 2, wherein the first output path comprises a switch.

4. The internal voltage control circuit of claim 1, wherein the second output path section is configured to operate when a plurality of bank active operations are to be performed simultaneously.

5. The internal voltage control circuit of claim 4, wherein the second output path section is configured to operate in an auto-refresh operation mode.

6. The internal voltage control circuit of claim 1, further comprising an output section configured to output enable signals of the first and second output path sections.

7. The internal voltage control circuit of claim 6, wherein the output section comprises a NOR gate.

8. The internal voltage control circuit of claim 1, wherein the second output path section comprises a delay element configured to delay the enable signal generated by the control unit by a predetermined time interval.

9. The internal voltage control circuit of claim 8, wherein the second output path section comprises a switch configured to transfer the enable signal generated by the control unit to the delay element.

10. The internal voltage control circuit of claim 1, wherein the time interval adjustment unit is configured to generate enable signals having at least three time intervals in response to the output of the control unit.

11. The internal voltage control circuit of claim 10, wherein the time interval adjustment unit comprises:
   a first time interval adjustment section configured to delay the output of the control unit by a first predetermined time interval and to supply the delayed output signal of the control unit to the active drivers; and
   a second time interval adjustment section configured to delay an output of the first time interval adjustment section by a second predetermined time interval and to supply the delayed output signal of the first time interval adjustment section to the active drivers.

12. The internal voltage control circuit of claim 10, wherein the time interval adjustment unit comprises a plurality of time interval adjustment sections coupled in parallel.

13. An internal voltage control circuit comprising:
   a plurality of active drivers configured to receive a common internal voltage; and
   a control block configured to control respective enable operations of the plurality of active drivers at respective predetermined time intervals during simultaneous operations of a plurality of banks,
   wherein the control block comprises;
      an enable signal generation unit configured to receive bank active addresses and to generate respective enable signals; and
      a time interval adjustment unit configured to supply the respective enable signals to the plurality of active drivers at respective predetermined time intervals.

14. The internal voltage control circuit of claim 13, wherein the time interval adjustment unit comprises a plurality of time interval adjustment sections coupled in parallel.

15. The internal voltage control circuit of claim 14, wherein the time interval adjustment unit is configured to generate enable signals having at least three time intervals from the enable signals generated by the enable signal generation unit.

16. The internal voltage control circuit of claim 15, wherein the time interval adjustment unit comprises:
   a first time interval adjustment section configured to delay the enable signals generated by the enable signal generation unit by a first predetermined time interval and to supply the delayed signals generated by the enable signal generation unit to the active drivers; and
   a second time interval adjustment section configured to delay enable signals supplied by the first time interval adjustment section by a second predetermined time interval and to supply the delayed output signals supplied by the first time interval adjustment section to the active drivers.

17. The internal voltage control circuit of claim 16, wherein the time interval adjustment unit comprises:
- an input section configured to input the enable signals generated by the enable signal generation unit;
- a first output path section configured to output the enable signals generated by the enable signal generation unit; and
- a second output path section configured to delay the enable signals generated by the enable signal generation unit by a predetermined time interval.

18. The internal voltage control circuit of claim 17, wherein the first output path section comprises a switch configured to be turned on/off in response to an all-bank operation control signal.

19. The internal voltage control circuit of claim 17, wherein the second output path section comprises a delay element configured to delay the enable signals generated by the enable signal generation unit by a predetermined time interval.

20. The internal voltage control circuit of claim 19, wherein the second output path section further comprises a switch configured to be turned on/off in response to an all-bank operation control signal and to transfer the enable signals generated by the enable signal generation unit to the delay element.

* * * * *